United States Patent
Takai et al.

(10) Patent No.: US 8,975,814 B2
(45) Date of Patent: Mar. 10, 2015

(54) SCATTERING FILM FOR ORGANIC EL, AND ORGANIC EL LIGHT-EMITTING DEVICE EQUIPPED WITH SAME

(75) Inventors: Masashi Takai, Saitama (JP); Toshiaki Ishibashi, Saitama (JP); Kazuya Kitajima, Saitama (JP)

(73) Assignee: Kimoto Co., Ltd., Saitama (JP)

( * ) Notice: Subject to any disclaimer, the term of this patent is extended or adjusted under 35 U.S.C. 154(b) by 178 days.

(21) Appl. No.: 13/700,459

(22) PCT Filed: May 26, 2011

(86) PCT No.: PCT/JP2011/062089
§ 371 (c)(1),
(2), (4) Date: Nov. 28, 2012

(87) PCT Pub. No.: WO2011/152275
PCT Pub. Date: Dec. 8, 2011

(65) Prior Publication Data
US 2013/0069524 A1 Mar. 21, 2013

(30) Foreign Application Priority Data
Jun. 2, 2010 (JP) ................. 2010-126841

(51) Int. Cl.
| H05B 33/12 | (2006.01) |
| G02B 5/02 | (2006.01) |
| H01L 51/52 | (2006.01) |
| H05B 33/02 | (2006.01) |
| H01L 51/50 | (2006.01) |

(52) U.S. Cl.
CPC ............ G02B 5/0242 (2013.01); H01L 51/504 (2013.01); H01L 51/5268 (2013.01); *H01L 2251/5369* (2013.01); H05B 33/02 (2013.01); *H01L 2251/55* (2013.01)
USPC ....................................... 313/504

(58) Field of Classification Search
None
See application file for complete search history.

(56) References Cited

U.S. PATENT DOCUMENTS

2009/0195152 A1* 8/2009 Sawano ................... 313/504

FOREIGN PATENT DOCUMENTS

| JP | 8-315985 A | 11/1996 |
| JP | 11-329742 A | 11/1999 |
| JP | 2003-173877 A | 6/2003 |

OTHER PUBLICATIONS

Machine translation of WO 2008-129790, published Oct. 30, 2008.*

* cited by examiner

*Primary Examiner* — Britt D Hanley
(74) *Attorney, Agent, or Firm* — Bacon & Thomas, PLLC

(57) ABSTRACT

Disclosed is a scattering film which can be used in an organic EL light-emitting device, in which the light utilization efficiency and field-of-view dependence, which have been problems so far in organic EL light-emitting devices, can be improved without interfering the two properties with each other. Specifically disclosed is a scattering film for an organic EL, which can be placed on the light emission surface side of an organic EL light-emitting device for use, and involves a scattering layer, wherein the scattering layer comprises a binder resin, microparticles having a different refractive index from that of the binder resin, and resin particles having a larger average particle diameter than that of the microparticles. The content of the microparticles is preferably 5 to 90 parts by weight relative to 100 parts by weight of the binder resin, and the content of the resin particles is preferably 100 to 300 parts by weight relative to 100 parts by weight of the binder resin.

11 Claims, 1 Drawing Sheet

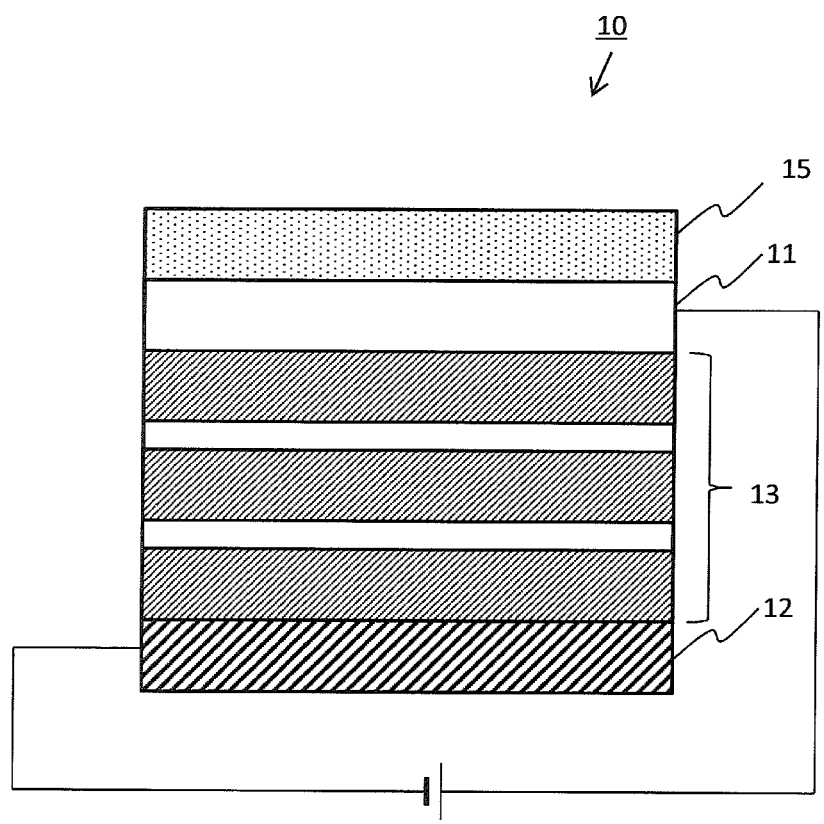

SCATTERING FILM FOR ORGANIC EL, AND ORGANIC EL LIGHT-EMITTING DEVICE EQUIPPED WITH SAME

TECHNICAL FIELD

The present invention relates to scattering films to be used in organic EL light-emitting devices.

BACKGROUND ART

There have been organic electroluminescent (organic EL) light-emitting devices that emit light by applying voltages to organic EL elements in which a light-emitting layer is interposed between a positive electrode (transparent electrode) and a negative electrode (back electrode). Since the organic EL light-emitting devices have advantages such as lightweight, small thickness, and low power consumption, they are used as backlights for liquid crystal displays and flat luminaires (Patent Document 1).

Although the organic EL light-emitting devices have the excellent features described above, they have following problems.

First, because an organic thin-film layer, such as a light-emitting layer, constituting an organic EL light-emitting device has a higher refractive index than air, total reflection of emitted light tends to occur at an interface. Therefore, there is a problem that light utilization efficiency is lower than 20% of the emitted light, i.e., light is mostly lost.

The organic EL light-emitting devices also have a problem of field-of-view dependence. Specifically, the light-emitting layer of an organic EL light-emitting device is made of a combination of a red-light-emitting layer, a green-light-emitting layer, and a blue-light-emitting layer. Because these light-emitting layers have different refractive indices, light is wavelength-separated at an interface between the light-emitting layers when the light-emitting surface of the organic EL light-emitting device is viewed obliquely. When the light is wavelength-separated, optical path lengths between the light-emitting layers change, and thus the light is seen with different hues depending on viewing angles. For example, when the organic EL light-emitting device is viewed from the front, such a change in optical path lengths is not likely to occur, and thus a change in color of light emitted from the organic EL light-emitting device is not likely to occur; however, when the device is viewed obliquely, light is seen with different hues due to a change in light path lengths between the light-emitting layers.

To solve the problems described above, a method has been proposed in which a diffusion layer is provided on the light-emission side of a light-emitting device to reduce variations in color tones by the light scattering effect of the diffusion layer (e.g., Patent Documents 2 and 3). Specifically, Patent Document 2 describes that a light-diffusing layer in which a light-diffusing material having a different refractive index from transparent resin is dispersed in the transparent resin is provided, and Patent Document 3 describes provision of a diffusion layer in which particles having a different refractive index from a transparent mother layer are scattered in the mother layer or a diffusion layer having a surface on which unevenness is provided by scattering relatively large particles in a transparent mother layer to scatter light.

PRIOR ART DOCUMENTS

Patent Documents

Patent Document 1: JP-A-8-315985
Patent Document 2: JP-A-11-329742
Patent Document 3: JP-A-2003-173877

SUMMARY OF THE INVENTION

Problems to be Solved by the Invention

By providing a diffusion layer, field-of-view dependence is lowered to some extent, but further lowering is required. If light diffusibility on the light-emission side has been merely improved to lower field-of-view dependence, there is a possibility that light utilization efficiency lowers, and hence there is a need to achieve both lowered field-of-view dependence and improved light utilization efficiency. Therefore, an object of the present invention is to provide an organic EL light-emitting device having high light utilization efficiency and considerably lowered field-of-view dependence.

Solutions to the Problems

The present inventors found that the problem of light utilization efficiency and the problem of field-of-view dependence can be solved without impeding the effects by providing the light-emitting surface side of an organic EL light-emitting device with a scattering film having a specific scattering layer, and the present invention has been completed.

That is, the scattering film for the organic EL according to the present invention is a scattering film used in organic EL light-emitting devices. The scattering film has a scattering layer containing binder resin, microparticles having a different refractive index from the binder resin (hereinafter simply referred to as "microparticles"), and resin particles having a larger average particle diameter than the microparticles. The scattering film is to be disposed on the light-emitting surface side of the organic EL light-emitting device.

For the scattering film for the organic EL according to the present invention, it is preferable that the average particle diameter of the microparticles be 1 μm or smaller and that the average particle diameter of the resin particles be 1 μm or larger.

In the scattering film for the organic EL according to the present invention, it is preferable that the content of the resin particles be 100 to 300 parts by weight per 100 parts by weight of the binder resin. Furthermore, in the scattering film for the organic EL according to the present invention, it is preferable that the content of the microparticles be 5 to 90 parts by weight per 100 parts by weight of the binder resin.

The organic EL light-emitting device according to the present invention has a pair of electrodes, an organic light-emitting layer provided between the pair of electrodes, and a scattering layer provided on a light emission surface of the light-emission-side electrode of the pair of electrodes. The scattering layer contains binder resin, microparticles having a different refractive index from the binder resin, and resin particles having a larger average particle diameter than the microparticles.

Effects of the Invention

According to the invention described above, lowered field-of-view dependence can be achieved while achieving improved light utilization efficiency by disposing on the light-emitting surface side of the organic EL light-emitting device a scattering layer containing binder resin, microparticles having a different refractive index from the binder resin, and resin particles having a larger average particle diameter than the microparticles.

The microparticles having a different refractive index from the binder resin are used to mainly achieve the lowered fieldof-view dependence, and the resin particles are used to achieve the improved light utilization efficiency without impeding the function of the microparticles. By containing both of the particles in the scattering layer, considerably lowered field-of-view dependence and improved light utilization efficiency can be achieved.

BRIEF DESCRIPTION OF THE DRAWING

FIG. 1 is a side cross-sectional view of one example of an organic EL light-emitting device according to the present invention.

MODE FOR CARRYING OUT THE INVENTION

Embodiments of a scattering film for organic EL (that may be hereinafter referred to as "scattering film") according to the present invention will be described below.

The scattering film for the organic EL according to the present invention includes a scattering layer. The scattering film can be a single scattering layer, or can include a support for the scattering layer and other layers as necessary. First, constituents of the scattering layer, i.e., mainly binder resin, resin particles, and microparticles will be described.

As the binder resin contained in the scattering layer according to the present invention, resin having excellent optical transparency can be used. Examples of the resin that can be used include thermoplastic resin, thermosetting resin, and ionizing radiation curable resin such as polyester resins, acrylic resins, acrylic urethane resins, polyester acrylate resins, polyurethane acrylate resins, epoxy acrylate resins, urethane resins, epoxy resins, polycarbonate resins, cellulosic resins, acetal resins, polyethylene resins, polystyrene resins, polyamide resins, polyimide resins, melamine resins, phenol resins, and silicone resins. Of these, the acrylic resins are preferably used from the viewpoint of excellent light resistance and optical properties.

As the binder resin, resin having a different refractive index from the microparticles described later is used. By making a difference in refractive index between the binder resin and the microparticles, wavelength-separated light rays can be scattered at the scattering layer, the scattered light rays can be regathered, and hence field-of-view dependence can be eliminated. Specifically, the refractive index of the binder resin is preferably about 1.4 to 1.65.

The resin particles are contained in the scattering layer to form unevenness on a surface of the scattering layer. As a result, light rays that could not have been emitted due to total reflection are emitted, and an improved light-emission rate is achieved. Although such unevenness can be formed even by using inorganic particles, the resin particles are used because the resin particles have higher light transmittance as compared with the inorganic particles, that is, resin particles absorb light very little, and light utilization efficiency as a whole can be improved.

Examples of such resin particles include silicone resin particles, acrylic resin particles, nylon resin particles, styrene resin particles, polyethylene particles, benzoguanamine resin particles, and urethane resin particles. Of these, silicone resin particles are preferably used in terms of enabling the achievement of not only improved light utilization efficiency but also lowered field-of-view dependence. As more preferred type of the silicone resin particles, there can be used silicone polymer particles in which siloxane bonds consisting of repetition of a silicon atom and oxygen atom bond, where organic groups directly bond to silicon atoms and the other bonds directly bond to oxygen atoms. Because surfaces of spherical particles of such silicone resin are covered by organic groups directly and firmly bonded to silicon atoms, dispersibility of the silicone resin particles into the binder resin is extremely high.

It is preferable that the resin particles have a refractive index of 1.3 to 1.6. Within such a range of the refractive index, lowered field-of-view dependence can be achieved while achieving improved light utilization efficiency.

The average particle diameter of the resin particles used is larger than the average particle diameter of the microparticles described later from the viewpoint of efficiently achieving improved light utilization efficiency. Specifically, to efficiently achieve improved light utilization efficiency without causing the resin particles to go out of the scattering layer, it is preferable that the average particle diameter of the resin particles fall within the range of 1 to 8 μm, and it is more preferable that the average particle diameter fall within the range of 1 to 5 μm. Furthermore, regarding the shape of the resin particles, an oval sphere shape or a true sphere shape is preferred, and a shape near to a true sphere shape is most preferred. If such particles with a definite shape are used as paint materials, dispersibility is extremely high, particle cluster formation due to secondary agglomeration does not occur, and a favorable sheet-shaped substance or coating film can be obtained.

The ratio of the resin particles to the binder resin contained in the scattering layer according to the present invention varies depending on the average particle diameter of the resin particles and the thickness of the scattering layer to be used. However, from the viewpoint of particularly achieving improved light utilization efficiency, it is preferable to contain the resin particles in an amount of 100 to 300 parts by weight per 100 parts by weight of the binder resin, and it is more preferable to contain the resin particles in an amount of 130 to 200 parts by weight per 100 parts by weight of the binder resin.

The microparticles having a different refractive index from the binder resin are used to mainly achieve lowered field-of-view dependence. By containing the microparticles having a different refractive index from the binder in the scattering layer, light rays that are wavelength-separated at an interface with a light-emitting layer such as a red-light-emitting layer can be scattered at the scattering layer, and the scattered light rays can be admixed. Therefore, there are little changes in hues even when the organic EL light-emitting device is viewed obliquely, and hence it can be considered that lowered field-of-view dependence is achieved.

As such microparticles, both organic microparticles and inorganic microparticles are used; however, it is preferable that inorganic microparticles be used from the viewpoints of easily achieving a different refractive index from the binder resin, easily dispersing wavelength-separated light rays, and easily admixing the dispersed light rays. Examples of the organic microparticles include hollow beads, poly trifluorochloroethylene microparticles, and polytetrafluoroethylene microparticles. Examples of the inorganic microparticles to be preferably used include microparticles of diamond, titanium oxide, zirconium oxide, lead oxide, lead carbonate, zinc oxide, zinc sulfide, antimony oxide, silica, aluminum hydroxide, barium sulfate, silicon oxide, lithium fluoride, and magnesium fluoride and so forth. Of these, zirconium oxide microparticles are preferably used from the viewpoints of particularly efficiently achieving lowered field-of-view dependence and so on.

The average particle diameter of the microparticles is preferably smaller than the average particle diameter of the resin particles. By using the microparticles having a smaller average particle diameter than the resin particles, improved light utilization efficiency by the resin particles and lowered field-of-view dependence by the microparticles can be achieved without impeding both achievements. Specifically, the average particle diameter of the microparticles to be used is preferably 0.5 to 1 µm.

It is preferable that the difference in a refractive index between the microparticles and the binder resin be 0.03 or larger. If high-refractive-index microparticles that have a higher refractive index than the binder resin are used, it is more preferable that the difference in a refractive index between both be 0.3 or larger. The refractive index of such high-refractive-index microparticles themselves is preferably 2.0 or higher. In contrast, if low-refractive-index microparticles that have a lower refractive index than the binder resin are used, the refractive index of such low-refractive-index microparticles is preferably 1.45 or lower. By setting the difference in a refractive index between the binder resin and the microparticles to 0.03 or larger, lowered field-of-view dependence can be achieved even when the content of the microparticles in the scattering layer is low and the light utilization efficiency is not decreased easily.

The ratio of the microparticles to the binder resin contained is set to 5 to 90 parts by weight per 100 parts by weight of the binder resin. With such a ratio, lowered field-of-view dependence can be achieved while achieving improved light utilization efficiency. In particular, by containing the microparticles in an amount of 15 to 60 parts by weight, the above effects are exerted significantly.

In the scattering layer, additives can be contained in addition to the binder resin, the resin particles, and the microparticles described above insofar as these functions are not inhibited. Examples of such additives include a cross-linking agent, a coloring agent, an antistatic agent, a fire retardant, an antifungus agent, a mildew-proofing agent, an ultraviolet absorbing agent, a light stabilizer, an antioxidizing agent, a plasticizing agent, a leveling agent, a dispersing agent, a flow regulating agent, and an antifoam agent.

The thickness of the scattering layer is preferably 3 to 15 µm from the viewpoint of easily preventing an occurrence of curl (curve) when formed as a scattering film.

The scattering layer can also be a single scattering film, but can be a scattering film laminated on a support.

When the scattering film is formed on the support, there are no particular limitations to what material(s) can be used to form the support. Examples of the material include polyester resins, acrylic resins, acrylic urethane resins, polyester acrylate resins, polyurethane acrylate resins, epoxyacrylate resins, urethane resins, epoxy resins, polycarbonate resins, cellulosic resins, acetal resins, vinyl resins, polyethylene resins, polystyrene resins, polypropylene resins, polyamide resins, polyimide resins, melamine resins, phenol resins, silicone resins, fluororesins, and cyclic olefin resins. As the support, a transparent plastic film can be used which is formed by using one of these kinds of resin or by combining two or more of them. Of these, an oriented, in particular, biaxially oriented polyethylene terephthalate film is preferred in terms of excellent mechanical strength and dimensional stability. Furthermore, to achieve a high degree of adhesiveness to the scattering layer, it is also preferable to use a film with a surface subjected to corona discharge treatment or provided with an easy bonding layer. In addition, it is preferable that the thickness of the support be generally about 10 to 400 µm.

In the scattering film according to the present invention, the surface opposite to the uneven surface can be subjected to antireflection treatment to achieve improved light transmittance. Furthermore, the opposite surface can be provided with an antistatic layer or an adhesive layer.

The scattering film according to the present invention can be fabricated by means of coating as follows. First, the binder resin, the resin particles, the microparticles, and the like described above are dissolved in a suitable solvent to prepare a coating liquid for scattering layer formation. Then the coating liquid is applied on the support by using a well-known method, for example, by using a bar coater, a blade coater, a spin coater, a roll coater, a gravure coater, a flow coater, or a die coater, or by spraying, screen printing, or the like. By drying the applied liquid the scattering film can be fabricated. Furthermore, by peeling the support off the laminate in which the scattering layer is formed on the support, a scattering film as a single scattering layer can also be fabricated.

Next, the organic EL light-emitting device according to the present invention will be described. The organic EL light-emitting device according to the present invention has a light-emitting surface to which the above scattering film according to the present invention is adhered, and the other structure of the organic EL light-emitting device is the same as the structure of well-known organic EL light-emitting devices.

FIG. 1 depicts an example of the organic EL light-emitting device 10. The organic EL light-emitting device includes an organic electroluminescent (organic EL) element in which a light-emitting layer 13 is sandwiched between a positive electrode (transparent electrode) 11 and a negative electrode (back electrode) 12, and a scattering layer 15 is provided on the light-emission side, i.e., on the side of the positive electrode 11. Furthermore, although not depicted, a support can be provided on the side of the positive electrode 11 or the side of the negative electrode 12 to sequentially laminate several layers. If such a support is provided on the transparent electrode side, a transparent material is used as the support.

The transparent electrode 11 can be formed of conductive metal oxide such as $SnO_2$, $In_2O_3$, and ITO. The negative electrode 12 can be formed of high-reflectance metal, such as Al, Ag, and Mo, or a high-reflectance alloy. These electrodes 11 and 12 can be deposited using a well-known method such as vapor deposition, sputtering, or ion plating.

As materials of which the light-emitting layer 13 is to be made up, a well-known organic light-emitting material or a well-known doping material is used. To emit white light, plural light-emitting layers 13 having different emission color (for example, a red-light-emitting layer, a blue-light-emitting layer, and a green-light-emitting layer) can be combined. As a method for combining the plural light-emitting layers 13, the plural layers can be laminated together, or the plural light-emitting layers can be deposited in a mosaic shape on the divided small regions on the light-emitting surface of the light-emitting device. When the plural layers are laminated together, a structure can be formed in which transparent electrodes are interposed between the adjacent light-emitting layers and voltages are applied to the light-emitting layers. Furthermore, a light-emitting layer that emits single-color light and a phosphor layer can also be combined to achieve white-light-emission. The present invention can be applied to all of these types of light-emitting devices.

The organic EL element can include a hole injection layer, a hole transport layer, an electron injection layer, an electron transport layer, a barrier layer, and other layers in addition to the light-emitting layer. As materials of which these layers are to be made up, well-known materials are used, and the layers can be formed using a well-known method such as vapor deposition.

Binder resin in the scattering layer 15 contains two kinds of particles having different functions, i.e., microparticles having a refractive index different from the binder resin and resin particles having a larger average particle diameter than the microparticles; therefore, the previously described scattering film according to the present invention can be used as the scattering layer 15. Such a scattering layer 15 is provided on the light-emission side so that a surface on which unevenness is formed by the resin particles serves as the light-emitting surface. As a method for providing the scattering film on the light-emission side, the scattering film can be adhered to the light-emission side directly or via a transparent adhesive layer or a transparent bonding layer, or can be formed by directly laminating the materials for the scattering layer on the outermost layer on the light-emission side by coating or the like.

In the organic EL light-emitting device according to the present invention, by providing such a specific scattering layer to the light-emission side, high light utilization efficiency and lowered field-of-view dependence can be achieved.

EXAMPLES

The present invention will be further described below with reference to Examples. Incidentally, units of "part" and "%" mean "part by weight" and "% by weight" unless otherwise specified.

1. Fabrication of Scattering Film

Example 1

After the following constituent components were mixed under agitation into a coating liquid for scattering layer formation, the coating liquid was applied onto a support, i.e., a 100-μm-thick polyethylene terephthalate film (Lumirror T60 available from Toray Industries Inc.) by bar coating. Then the applied liquid was dried to give an 8-μm-thick scattering layer, i.e., a scattering film according to Example 1.

| <Coating Liquid For Scattering Layer Formation Used In Example 1> | |
|---|---|
| Acrylic Polyol | 15.47 Parts |
| (ACRYDIC A-804 Available from DIC Corporation, Solid Content: 50%, Refractive Index: 1.5) | |
| Isocyanate Curing Agent | 3.78 Parts |
| (TAKENATE D110N Available from Mitsui Chemicals Inc., Solid Content: 60%) | |
| Silicone Resin Particles | 16.8 Parts |
| (KMP-701 Available from Shin-Etsu Chemical Co., Ltd) (Average Particle Diameter: 3.5 μm, Refractive Index: 1.45) | |
| Zirconium Oxide | 1.5 Parts |
| (Average Particle Diameter: 0.5 μm, Refractive Index: 2.4) | |
| Diluting Solvent | 33.84 Parts |

Example 2

A scattering film according to Example 2 was obtained in the same manner as Example 1 except that the content of the zirconium oxide in the coating liquid for scattering layer formation used in Example 1 was changed to 3 parts by weight.

Example 3

A scattering film according to Example 3 was obtained in the same manner as Example 1 except that the content of the zirconium oxide in the coating liquid for scattering layer formation used in Example 1 was changed to 6 parts by weight.

Example 4

A scattering film according to Example 4 was obtained in the same manner as Example 1 except that the content of the zirconium oxide in the coating liquid for scattering layer formation used in Example 1 was changed to 0.75 parts by weight.

Example 5

A scattering film according to Example 5 was obtained in the same manner as Example 1 except that the content of the silicone resin particles and the content of the zirconium oxide in the coating liquid for scattering layer formation used in Example 1 were changed respectively to 14.3 parts and 2.3 parts.

Example 6

A scattering film according to Example 6 was obtained in the same manner as Example 5 except that the content of the silicone resin particles in the coating liquid for scattering layer formation used in Example 5 was changed to 19.3 parts.

Reference Example 1

A scattering film according to Reference Example 1 was obtained in the same manner as Example 1 except that the content of the zirconium oxide in the coating liquid for scattering layer formation used in Example 1 was changed to 12 parts by weight.

Example 7

A scattering film according to Example 7 was obtained in the same manner as Example 1 except that the coating liquid for scattering layer formation used in Example 1 was replaced with the following coating liquid.

| <Coating Liquid For Scattering Layer Formation Used In Example 7> | |
|---|---|
| Acrylic Polyol | 15.47 Parts |
| (ACRYDIC A-804 Available from DIC Corporation, Solid Content: 50%, Refractive Index: 1.5) | |
| Isocyanate Curing Agent | 3.78 Parts |
| (TAKENATE D110N Available from Mitsui Chemicals Inc., Solid Content: 60%) | |
| Silicone Resin Particles | 16.8 Parts |
| (KMP-701 Available from Shin-Etsu Chemical Co., Ltd) (Average Particle Diameter: 3.5 μm, Refractive Index: 1.45) | |
| Calcium Carbonate | 3.0 Parts |
| (Average Particle Diameter: 1 μm, Refractive Index: 1.57) | |
| Diluting Solvent | 33.84 Parts |

Example 8

A scattering film according to Example 8 was obtained in the same manner as Example 1 except that the coating liquid for scattering layer formation used in Example 1 was replaced with the following coating liquid.

| <Coating Liquid For Scattering Layer Formation Used In Example 8> | |
|---|---|
| Acrylic Polyol | 15.47 Parts |
| (ACRYDIC A-804 Available from DIC Corporation, Solid Content: 50%, Refractive Index: 1.5) | |

-continued

| <Coating Liquid For Scattering Layer Formation Used In Example 8> | |
|---|---|
| Isocyanate Curing Agent (TAKENATE D110N Available from Mitsui Chemicals Inc., Solid Content: 60%) | 3.78 Parts |
| Silicone Resin Particles (KMP-701 Available from Shin-Etsu Chemical Co., Ltd) (Average Particle Diameter: 3.5 μm, Refractive Index: 1.45) | 16.8 Parts |
| Silicon Oxide (Average Particle Diameter: 0.5 μm, Refractive Index: 1.45) | 5.0 Parts |
| Diluting Solvent | 33.84 Parts |

Comparative Example 1

A scattering film according to Comparative Example 1 was obtained in the same manner as Example 1 except that the coating liquid for scattering layer formation used in Example 1 was replaced with the following coating liquid and that the thickness of a scattering layer to be formed after drying was 3 μm.

| <Coating Liquid For Scattering Layer Formation Used In Comparative Example 1> | |
|---|---|
| Acrylic Polyol (ACRYDIC A-804 Available from DIC Corporation, Solid Content: 50%, Refractive Index: 1.5) | 15.47 Parts |
| Isocyanate Curing Agent (TAKENATE D110N Available from Mitsui Chemicals Inc., Solid Content: 60%) | 3.78 Parts |
| Calcium Carbonate (Average Particle Diameter: 1 μm, Refractive Index: 1.57) | 8.4 Parts |
| Diluting Solvent | 33.84 Parts |

Comparative Example 2

A scattering film according to Comparative Example 2 was obtained in the same manner as Example 1 except that the coating liquid for scattering layer formation used in Example 1 was replaced with the following coating liquid.

| <Coating Liquid For Scattering Layer Formation Used In Comparative Example 2> | |
|---|---|
| Acrylic Polyol (ACRYDIC A-804 Available from DIC Corporation, Solid Content: 50%, Refractive Index: 1.5) | 15.47 Parts |
| Isocyanate Curing Agent (TAKENATE D110N Available from Mitsui Chemicals Inc., Solid Content: 60%) | 3.78 Parts |
| Acrylic Resin Particles (TECHPOLYMER MBX-8 Available from Sekisui Plastics Co., Ltd.) (Average Particle Diameter: 7 μm, Refractive Index: 1.49) | 17 parts |
| Diluting Solvent | 33.84 Parts |

2. Fabrication of Organic EL Light-Emitting Device

The scattering films fabricated in Examples 1 to 8, Reference Example 1, and Comparative Examples 1 and 2 were adhered onto the light-emitting surfaces of organic EL light-emitting devices manufactured by Osram AG. (Product Name: ORBEOS CDW-031) to obtain organic EL light-emitting devices each having the scattering film.

3. Evaluation (1) Light Utilization Efficiency

The organic EL light-emitting devices having the scattering films according to Examples 1 to 8, Reference Example 1, and Comparative Examples 1 and 2 were made to emit light by applying a voltage of 3.5 V and a current of 120 mA to the devices to measure the light-emission efficiency. In addition, the light-emission efficiency of an organic EL light-emitting device without scattering film as a comparison reference was also measured. The results of the measurement are shown in Table 1.

(2) Field-of-View Dependence

Angular fields of view with respect to the organic EL light-emitting devices having the scattering films were changed in the range of −85° to +85° (it was assumed that the front of the organic EL light-emitting device was 0°) to measure chromaticity (CIE colorimetric system (1931)) by using a color luminance meter (CS-100 available from Konica Minolta Holdings Inc.). The difference Δx between the maximum value (max) and the minimum value (min) of chromaticity x was obtained by Equation (1), and the difference Δy between the maximum value (max) and the minimum value (min) of chromaticity y was obtained by Equation (2). Then color difference ΔE was calculated by Equation (3) as an index for field-of-view dependence evaluation. For the organic EL light-emitting device without scattering film as the comparison reference too, color difference ΔE was measured and calculated. The results are shown in Table 1.

[Equations 1]

$$\Delta x = x_{max} - m_{min} \quad (1)$$

$$\Delta y = y_{max} - y_{min} \quad (2)$$

$$\Delta E = \sqrt{\Delta x^2 + \Delta y^2} \quad (3)$$

TABLE 1

| | Light-Emission Efficiency (lm/W) | Color Difference ΔE |
|---|---|---|
| Without Scattering Film | 7.800 | 0.043 |
| Example 1 | 12.300 | 0.0038 |
| Example 2 | 12.000 | 0.0016 |
| Example 3 | 11.400 | 0.0013 |
| Example 4 | 12.400 | 0.0054 |
| Example 5 | 11.700 | 0.0044 |
| Example 6 | 11.550 | 0.0017 |
| Example 7 | 11.700 | 0.0018 |
| Example 8 | 11.200 | 0.0032 |
| Reference Example 1 | 9.000 | 0.0019 |
| Comparative Example 1 | 8.400 | 0.0022 |
| Comparative Example 2 | 12.500 | 0.014 |

From the results in Table 1, it can be seen that the scattering films according to Examples 1 to 8, which include the scattering layer containing the binder resin, the resin particles, and the microparticles having a different refractive index from the binder resin, have high light utilization efficiency and low field-of-view dependence. In the case where the content of the microparticles having a different refractive index exceeds a suitable value (in Reference Example 1), light-emission efficiency is low as compared with the efficiency of the scattering films according to Examples 1 to 8 in which the content of the microparticles is in the range of 5 to 90 parts by weight per 100 parts by weight of the binder resin. Furthermore, in Comparative Example 1 in which no resin particles are used, it has been confirmed that lowered field-of-view dependence is achieved but the effect of improving light-emission efficiency is not obtained much. In Comparative Example 2 in which no microparticles are used, it has been confirmed that improved light-emission efficiency is achieved but there is little effect of lowered field-of-view dependence.

In the scattering films according to Examples 1 to 3 and 5 to 8 in which the content of the microparticles is in the range of 15 to 60 parts by weight per 100 parts by weight of the binder resin, it has been confirmed that the light utilization efficiency is particularly high and the field-of-view dependence is low.

The invention claimed is:

1. A scattering film to be used in an organic EL light-emitting device, the scattering film including a scattering layer that contains:
    binder resin;
    microparticles having a different refractive index from the binder resin; and
    resin particles having a larger average particle diameter than the microparticles, wherein
    the microparticles include zirconium oxide particles and the content of the microparticles is 5 to 90 parts by weight per 100 parts of the binder resin,
    the resin particles include silicone resin particles and the content of the resin particles is 100 to 300 parts by weight per 100 parts by weight of the binder resin, and
    the scattering film is disposed on the side of a light-emitting surface of the organic EL light-emitting device.

2. The scattering film for organic EL according to claim 1, wherein the average particle diameter of the microparticles is 1 µm or smaller and the average particle diameter of the resin particles is 1 µm or larger.

3. The scattering film for organic EL according to claim 1, wherein the resin particles are silicone resin particles.

4. The scattering film for organic EL according to claim 1, wherein the microparticles are inorganic particles.

5. The scattering film for organic EL according to claim 4, wherein the inorganic particles are zirconium oxide particles.

6. An organic EL light-emitting device comprising:
    a pair of electrodes;
    an organic light-emitting layer provided between the pair of electrodes; and
    a scattering layer provided on a light emission surface of the light-emission-side electrode of the pair of electrodes,
    wherein the scattering layer contains binder resin, microparticles having a different refractive index from the binder resin, and resin particles having a larger average particle diameter than the microparticles; and wherein
    the microparticles include zirconium oxide particles and the content of the microparticles is 5 to 90 parts by weight per 100 parts of the binder resin,
    the resin particles include silicone resin particles and the content of the resin particles is 100 to 300 parts by weight per 100 parts by weight of the binder resin.

7. A scattering film to be used in an organic EL light-emitting device, the scattering film including a scattering layer that comprises:
    a binder resin;
    zirconium oxide microparticles having a different refractive index from the binder resin and the content of the zirconium oxide microparticles is 5 to 90 parts by weight per 100 parts of the binder resin; and
    silicone resin particles having a larger average particle diameter than the microparticles, the silicone resin particles is 100 to 300 parts by weight per 100 parts by weight of the binder resin, and
    the scattering film is disposed on the side of a light-emitting surface of the organic EL light-emitting device.

8. The scattering film for organic EL according to claim 7, wherein the average particle diameter of the microparticles is 1 µm or smaller and the average particle diameter of the resin particles is 1 µm or larger.

9. The scattering film of claim 7, wherein the refractive index of the resin particles is 1.3 to 1.6, the refractive index of the resin binder is 1.4 to 1.65 and the particle size of the resin particles are within the range of from 1 to 8 µm.

10. The scattering film of claim 7 wherein the difference in refractive index between the microparticles and the resin binder is 0.03 or larger.

11. The scattering film of claim 1 wherein the difference in refractive index between the microparticles and the resin binder is 0.03 or larger.

* * * * *